(12) United States Patent
Nuytkens et al.

(10) Patent No.: US 6,838,750 B2
(45) Date of Patent: Jan. 4, 2005

(54) INTERCONNECT CIRCUITRY, MULTICHIP MODULE, AND METHODS OF MANUFACTURING THEREOF

(75) Inventors: Peter R. Nuytkens, Melrose, MA (US); Ilya E. Popeko, Forest Hills, NY (US); Joseph M. Kulinets, Stamford, CT (US)

(73) Assignee: Custom One Design, Inc., Melrose, MA (US)

( * ) Notice: Subject to any disclaimer, the term of this patent is extended or adjusted under 35 U.S.C. 154(b) by 0 days.

(21) Appl. No.: 09/904,306

(22) Filed: Jul. 12, 2001

(65) Prior Publication Data

US 2003/0011049 A1 Jan. 16, 2003

(51) Int. Cl.[7] .............................................. H01L 23/495
(52) U.S. Cl. ...................... 257/666; 257/667; 257/668; 257/635; 257/758; 257/700; 257/324
(58) Field of Search ................................ 257/666–667, 257/668, 671, 677, 758, 762, 773, 797, 774, 782, 700, 635, 324; 438/118, 123, 458, 460, 459, 464

(56) References Cited

U.S. PATENT DOCUMENTS

| | | | |
|---|---|---|---|
| 3,903,590 A | * 9/1975 | Yokogawa ................... 257/708 |
| 4,783,695 A | * 11/1988 | Eichelberger et al. ....... 257/700 |
| 4,954,811 A | * 9/1990 | Chatigny et al. ............ 340/550 |
| 5,161,093 A | * 11/1992 | Gorczyca et al. ........... 361/795 |
| 5,353,498 A | * 10/1994 | Fillion et al. ................ 438/107 |
| 5,373,627 A | * 12/1994 | Grebe ......................... 257/702 |
| 5,874,770 A | * 2/1999 | Saia et al. ................... 257/536 |
| 6,034,332 A | * 3/2000 | Moresco et al. ............. 257/623 |
| 6,194,291 B1 | * 2/2001 | DiStefano et al. .......... 438/455 |
| 6,194,317 B1 | * 2/2001 | Kaisaki et al. .............. 438/692 |
| 6,274,821 B1 | * 8/2001 | Echigo et al. ............... 257/702 |
| 2001/0002275 A1 | * 5/2001 | Oldenburg et al. ........... 438/63 |
| 2002/0163076 A1 | * 11/2002 | Tzeng et al. ................. 257/720 |

* cited by examiner

*Primary Examiner*—Donghee Kang
*Assistant Examiner*—Quang Vu
(74) *Attorney, Agent, or Firm*—Perkins Smith & Cohen LLP; Jacob N. Erlich; John A. Hamilton

(57) ABSTRACT

An electrical circuit having one or more dielectric layers formed of latex; and one or more layers of electrically conductive material, such as copper, patterned to form multiple electrical interconnects, with each such layer placed on top of one of said dielectric layers. The dielectric and conductive layers can be used to connect multiple chips in a multichip module. The latex layers can be formed to have a top surface that contains peaks and valleys, and the conductive layers can be formed of a first metal that substantially fills such valleys, so as to increase the adherence of the metal to the latex surface. The layers of conductive metal can contain particles of a second metal between said peaks and valleys of the latex layer that were used as a catalytic seed particles to promote the deposition of the metal layer onto the top surface of the latex.

10 Claims, 13 Drawing Sheets

INTERCONNECT CIRCUITRY, MULTICHIP MODULE, AND METHODS OF MANUFACTURING THEREOF

BACKGROUND OF THE INVENTION

The present invention relates to interconnect circuitry that can be used to connect electrical components, to multichip modules which use such interconnect circuitry, and to methods of making such interconnect circuitry and multichip modules.

A major concern in manufacture electronic circuitry is the expansion and contraction of circuit components that can result as those components heated up and cooled down during operation. Today is not uncommon for an individual integrated circuit to give off as much heat as a 100-watt light bulb. Thus it can be seen that dealing with such heat is a major concern in circuit design. Not only must materials out of which circuits are manufactured be capable of handling the temperatures created in such circuitry, but they must also be capable of handling the pressures due to expansion and contraction caused by such heating and cooling.

Unfortunately many of the materials used to manufacture integrated circuits are not as good at handling these pressures as could be desired. For example, polyimide, a commonly used dielectric in the manufacture of integrated circuits and multichip modules is rather brittle once it has been cured (i.e., hardened). Attempts have been made to manufacture multichip modules using polyimide as the material to support conductive leads between individual integrated circuits contained in such modules. In the past such modules have failed as a result of the inability of polyimide to handle thermal expansion and contraction without cracking.

On large integrated circuits pressures due to thermal expansion contraction can also cause problems for the inflexible dielectric materials such as polyimide.

Thermal expansion and contraction can also create problems for many traditional methods of mounting integrated circuits upon printed circuit boards or multichip module substrates. Because integrated circuit normally have substrates made of different material than the substrate on which they are mounted, and because such chips often generate much more heat than substrate on which they are mounted, such chips often expand or contract in a different rate than their mounting substrate. For example, when chips are mounted upon rigid substrate using ball grid mounting, the pressure which the solder balls used in such mountings have to bear is often huge. In fact, on some occasions enough to break the solder connections holding such chips to their substrate.

Thus it can be seen that would be advantageous to develop methods of interconnecting electrical circuitry that has a greater capability to deal with the pressures due to thermal expansion and contraction.

It is an object of the present invention to provide electrical connections between electronic components which address the thermal expansion and contraction issues discussed in the background of the invention.

It is another object of the present invention to provide electrical connections that can be formed at relatively low temperatures.

It is yet another object of the present invention to provide electrical connections that can withstand expansion and contraction due to heating and cooling of electronic components.

It is still another object of the present invention to provide improved multichip modules and methods for making them.

It is yet another object of the present invention to provide multichip modules that have electrical connections between their integrated circuits that have a relatively high capability to withstand expansion and contraction caused by heating and cooling of components within such modules.

SUMMARY OF THE INVENTION

According to a first aspect of the present invention a method is provided for plating metallic material on the surface of a dielectric material. The method comprises the dipping the surface of the dielectric material in a solution containing catalytic metal particles which have a slight electrostatic dipole when in solution to help those particles attach to the dielectric material's surface; and the placing the surface of the dielectric material in a metal salt solution in metastable equilibrium with a reducing agent so as to cause the metal to be plated upon the surface of the dielectric material containing the catalytic metal particles by a process of electroless plating.

Some embodiments of this first aspect of the invention further including, before dipping the dielectric material in the solution of catalytic metal particles, plasma etching the surface of the dielectric material to roughen its surface and to create peaks and valleys in the surface of that material. These peaks and valleys have van der Waal forces associated with them capable of attracting catalytic particles that have a slight electrostatic dipole. In some such embodiments the plasma etching is a non-reactive ion etching. In other embodiments the surface on which deposition is to take place can be roughened by other means such as chemical etch or by mechanical abrasion.

In some embodiments of this first aspect of the invention the dielectric material is latex. In others the dielectric material is polyimide. In some embodiments the material deposited by the electroless plating is a conductor, such as copper. In other embodiments the material deposited by the electroless plating is a ferromagnetic material, such as phosphorus doped nickel or boron doped nickel.

In some embodiments of this first aspect of the invention the catalytic particles are particles of one of the following metals: cobalt, palladium, ruthenium, rhodium, platinum, iridium, osmium, nickel, or iron. In some embodiments the solution containing the catalytic particles contains chemicals to reduce the tendency of the catalytic particles to conglomerate in solution. In some embodiments, the method further includes using electroplating to put down an additional thickness of material on top of the layer of material that has been deposited by electroless plating.

According to a first aspect of the present invention an electrical circuit is provided which is comprised of the following: one or more dielectric layers comprised of latex; and one or more layers of electrically conductive material patterned to form multiple electrical interconnects, with each such layer placed on top of one of said dielectric layers.

In some embodiments of this second aspect of the invention the electrically conductive material is copper. In some embodiments the dielectric and conductive layers are used to connect individual bonding pads on different integrated circuits which are part of a multichip module.

In some embodiments of this second aspect of the invention the circuit has been made by a process comprising the following: dipping the surface of the dielectric material in a solution containing catalytic metal particles which have a slight electrostatic dipole when in solution to help those particles attach to the dielectric material's surface; and placing the surface of the dielectric material in a metal salt solution in metastable equilibrium with a reducing agent so as to cause a layer of conductive metal to be plated upon the surface of the dielectric material containing the catalytic metal particles by a process of electroless plating. In some such embodiments the process further includes, before dipping the dielectric material in the solution of catalytic metal particles, plasma etching the surface of the dielectric material to roughen its surface and to create peaks and valleys in the surface of that material. These peaks and valleys have van der Waal forces capable of attracting catalytic particles that have a slight electrostatic dipole.

In some embodiments of this second aspect of the invention the process used to make the circuit further includes using electroplating to put down an additional thickness of conductive material on the layer of conductive material which has been deposited by electroless plating.

According to a third aspect of the present invention a multichip module is provided which includes the following: a plurality of integrated circuits mounted on a substrate; one or more dielectric layers comprised of a flexible dielectric material; and one or more layers of electrically conductive material patterned to form multiple electrical interconnects between bonding pads on different ones of the integrated circuits, with each such layer placed on top of a one of the dielectric layers.

In some embodiments of this third aspect of the invention the dielectric material is latex. In other embodiments of the invention the dielectric material is a silicon based adhesive.

In some embodiments of this third aspect of the invention the multichip module is one that has been made by the following electroless plating process: dipping the surface of the dielectric material in a solution containing catalytic metal particles which have a slight electrostatic dipole when in solution to help those particles attach to the dielectric material's surface; and placing the surface of the dielectric material in a metal salt solution in metastable equilibrium with a reducing agent so as to cause a layer of conductive metal to be plated upon the surface of the dielectric material containing the catalytic metal particles by a process of electroless plating.

In some embodiments this electroless plating process further includes, before dipping the dielectric material in the solution of catalytic metal particles, plasma etching the surface of the dielectric material to roughen its surface and to create peaks and valleys in the surface of that material which have van der Waal forces capable of attracting catalytic particles which have a slight electrostatic dipole.

In some embodiment the electroless plating process is followed by electroplating to put down an additional thickness of conductive material on the layer of conductive material which has been deposited by electroless plating.

According to a fourth aspect of the invention, a method of manufacturing a multichip module is provided. This method places a frame on a first flat substrate, which frame has holes in it for positioning and holding integrated circuit chips. Integrated circuit chips are placed through the frame to planarize their top, active, surfaces against the first flat substrate. The first substrate is removed from the frames and the chips. One or more layers of dielectric are placed on top of the frames and chips. Photolithographic techniques are used to etch vias through each of the one or more dielectric layers to allow selective contact to conductive bonding pads on individual chips or conductive paths on a dielectric layer below. Photolithographic techniques are also used to lay down conductive material in such vias and in desired conductive pathways on the currently to layer of dielectric material.

In some embodiments of this forth aspect of the invention the method further including placing a layer of adhesive dicing tape between the frame and the first flat substrate to help adhere the frame and the tops of the chips to the same planar level.

In some embodiments of this forth aspect of the invention the method further includes placing epoxy on the back of chips and attaching the chips and frame to a second substrate on the opposite side of the frame from first substrate. In some such embodiments, the epoxy is both thermally and electrically conducting. In some embodiments the second substrate is a ball grid pad. In some embodiments the second substrate has had passive components formed on it before attachment to the frame and the chips held in the frame.

In some embodiments of the forth aspect of the invention the frame is made of plastic.

In some embodiments of the fourth aspect the dielectric material is flexible, and the conductive material can be a ductile conductive material, such as, for example, copper. When both a flexible dielectric and conductive material are used, the connective layers formed of those two material can have the ability to flex under pressure, such as that generated by thermal heating and cooling.

In some embodiments of the fourth aspect of the invention the dielectric material is latex. In others it is a silicon based adhesive.

In some embodiments of the fourth aspect of the invention the photolithographic techniques for laying down conductive material comprises the following: dipping the surface of the dielectric material in a solution containing catalytic metal particles which have a slight electrostatic dipole when in solution to help those particles attach to the dielectric material's surface; and placing the surface of the dielectric material in a metal salt solution in metastable equilibrium with a reducing agent so as to cause a layer of conductive metal to be plated upon the surface of the dielectric material containing the catalytic metal particles by a process of electroless plating. In some such embodiments this electroless plating method includes, before dipping the dielectric material in the solution of catalytic metal particles, plasma etching the surface of the dielectric material to roughen its surface and to create peaks and valleys in the surface of that material which have van der Waal forces capable of attracting catalytic particles which have a slight electrostatic dipole. This plasma etch is commonly a non-reactive ion etching, because commonly a dielectric material which does not already have a rough enough surface to have the desired van der Waal forces can be given one by non-reactive ion etching, which is somewhat analogous to sandblasting in operation.

In some of the embodiments of the fourth aspect of the invention which used the electroless plating process, electroplating is also used to put down an additional thickness of conductive material on top of the layer of conductive material which has been deposited by electroless plating.

According to a fifth aspect of the invention, a second method of manufacturing a multichip module is provided which is similar to that described above, except that it down not used frames of the type discussed with regard to the fourth aspect of the invention.

The method of fifth aspect of the invention comprises the following: placing integrated circuit chips against a first flat substrate to planarize their top, active, surfaces against that first substrate; placing epoxy on the back of the chips; attaching the chips to a second substrate on the opposite side of the chips from the first substrate; removing the first substrate (this could be done after the filler material has been applied and hardened); filling the space between the chips with fluid filler material which can be hardened into a relatively flexible material; hardening the filler material; placing one or more additional layers of dielectric material on top of the filler material and the chips; using photolithographic techniques to etch vias through each of the additional dielectric layer to allow selective contact to conductive bonding pads on chips or conductive paths on dielectric layer below; and using photolithographic techniques to lay down conductive material in vias and in desired conductive pathways on the current top dielectric layer.

In some embodiments of this fifth aspect of the present invention the dielectric material of the additional layers is latex. In other embodiments the dielectric material of the additional layers is a silicon based adhesive.

In some embodiments of the fifth aspect of the invention the filler material is latex. In other embodiments it is a silicon based adhesive In some embodiments of the fifth aspect of the invention Teflon coated pins are used to form holes in the filler material as it is hardened. In some such embodiments the resulting holes can be used as vias through the layer formed by the filler material. These pins can either be in the first substrate, if that substrate is not removed until after the filler had been put in placed and hardened, or it could be on a separate third surface placed over the top of the second substrate and the chips after the first substrate has been removed. Such a third surface could also help flatten out the filler to a level close to that of the tops of the chips.

DESCRIPTION OF THE DRAWINGS

These and other aspects of the present invention will become more evident upon reading the following description of the preferred embodiment in conjunction with the accompanying drawings, in which.

DETAILED DESCRIPTION OF PREFERRED EMBODIMENTS

Figure 1:
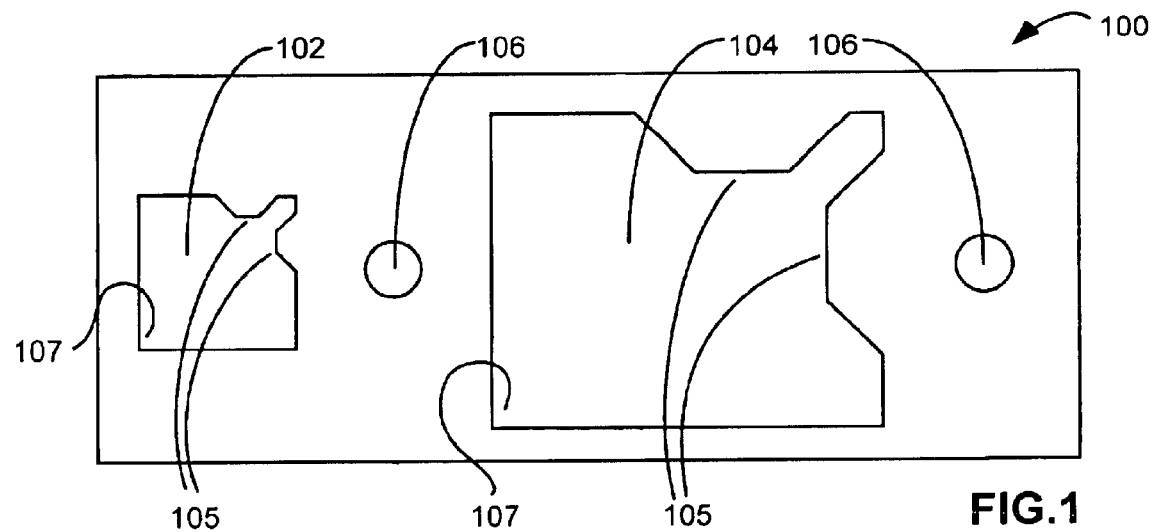
FIG. 1 is a top view of a plastic frame used to hold chips in position according to a method of manufacturing multichip modules according to one aspect of the present invention.

FIG. 1 illustrates a plastic frame 100 which is used in one aspect of the present invention to help hold individual integrated circuits in multichip modules. This frame includes holes 102 and 104 into which integrated circuits can be placed. The frame shown in FIG. 1 includes flexible tabs 105 which are designed to press against the sides of chips as they are inserted in the holes so as to press the opposite corner of the integrated circuit into the corner 107 of their associated hole. These tabs help frames to deal with the fact those different instances of the same type of chip often very slightly in size.

The plastic frame shown in FIG. 1 normally will be part of a much larger continuous sheet of such frames. Likewise the dicing tape and substrates discussed below are also normally equivalent in size so as to enable many multichip modules to be assembled at one time, and then later be diced into individual multichip modules.

The plastic frame shown in FIG. 1 is designed to have an integrated circuit fit into the hole 102 that has a relatively large field effect transistor and accompanying circuit on it. The larger hole 104 is designed to hold a larger controller chip that drives the field effect transistor. It should be appreciated that in other embodiments of the invention multichip modules having a larger number or different combination of integrated circuits can be manufactured by the methods described herein.

The role of the plastic frame is to fill the empty space between the chips of a multichip module, to help keep in place the thermally conductive epoxy that is pasted underneath individual chips, and to provide the necessary flexibility to deal with the expansion contraction that occurs within a multichip module occurs during thermal cycling.

Figure 7:
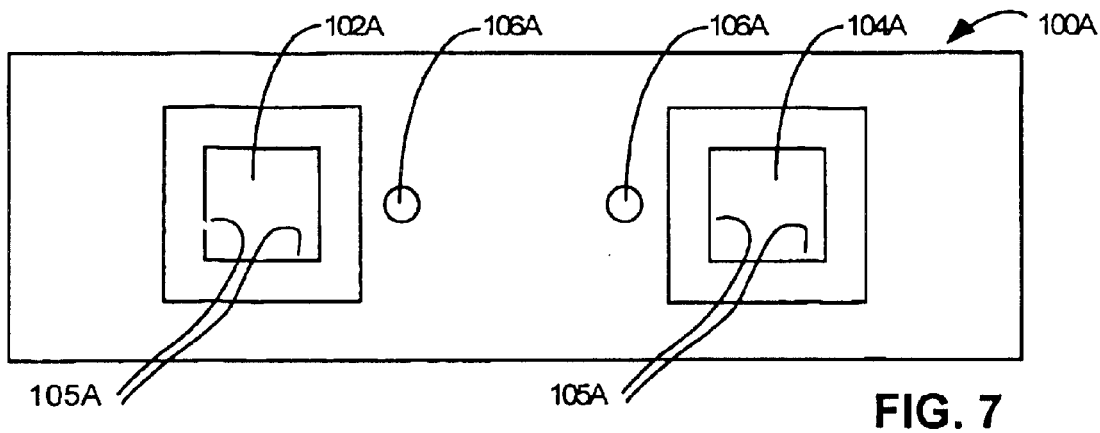
FIG. 7 is a top view of another plastic frame that can be used with certain aspects of the present invention.
Figure 8:
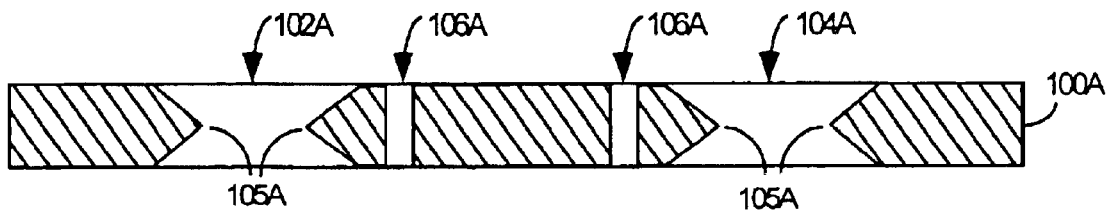
FIG. 8 is a cross-sectional view of the plastic frame shown in FIG. 7.

Plastic frames of the type shown in FIG. 1 and FIG. 7 can be inexpensively manufactured using high precision, high polish molds. These frames to be made of plastic such as polypropylene, ABS (Acryl-Butyl-Styrene), Polycarbonate, and alloys of polycarbonate and ABS. These materials all have the combination of sufficient strength and flexibility to properly hold integrated circuits during construction and to accommodate thermal expansion and contraction of the module after assembly. Other types of material that can be used for frames are silicon-based adhesives. These are materials made of chemicals in which the carbon atoms have been replaced by silicon. One example of such materials is Syguard, which is manufactured by Dow Chemical. These materials not only have the necessary flexibility but they have good thermal conductivity that is an additional desired quality for material used in multichip modules.

The holes 106 in the frame of FIG. 1 are via holes in which conductive material will be placed to conduct current down to conductors in the substrate which will be affixed to the bottom of the frame.

Figure 2:
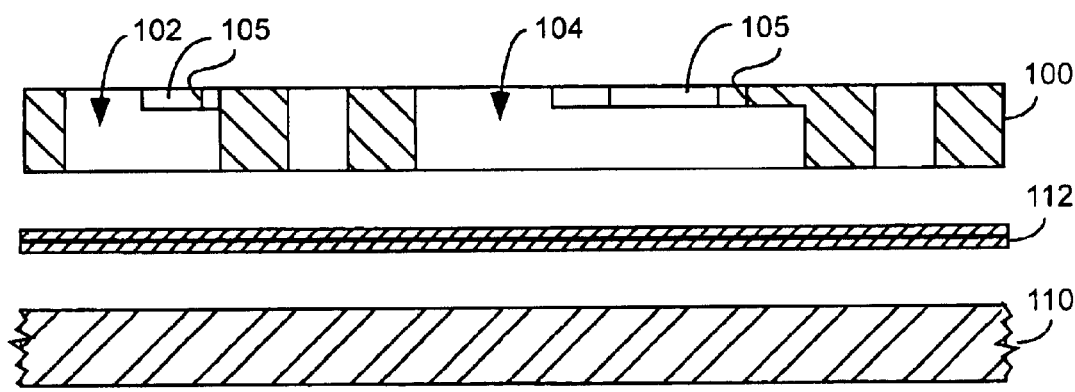
FIG. 2 is a cross-sectional view of the frame shown in FIG. 1 being positioned above a glass substrate and a portion of dicing tape between the frame and a glass substrate.

FIG. 2 shows the frame 100 placed above a glass substrate 110, with a sheet of the dicing tape 112 placed between it and that substrate. In the embodiment disclosed the dicing tape 112 has an adhesive on both sides. In other embodiments, dicing tape having adhesive only on the side facing the chips 114 and 116 could be used, although this would normally require that the process described below in FIG. 11 be performed with the frame 100 on top of substrate 110 and the "bottom substrate" above the frame.

Figure 3:
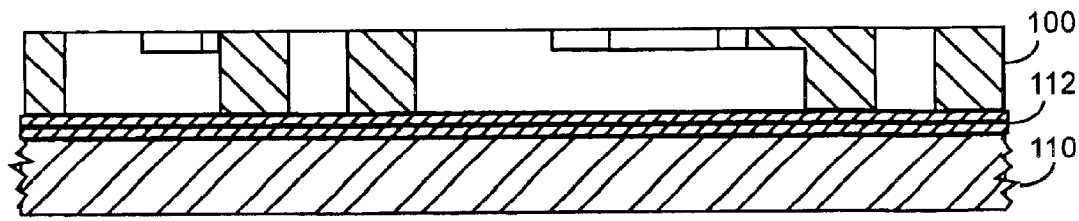
FIG. 3 is a cross-sectional view similar to that of FIG. 2 except that it shows the frame adhered to the glass substrate by the dicing tape.

FIG. 3 illustrates the combination of the frame, the dicing tape, and the substrate 110 once the frame has been pressed down onto the substrate with the dicing tape in between. The adhesive on both sides of the dicing tape causes the frame to stick to the glass substrate.

Figure 4:
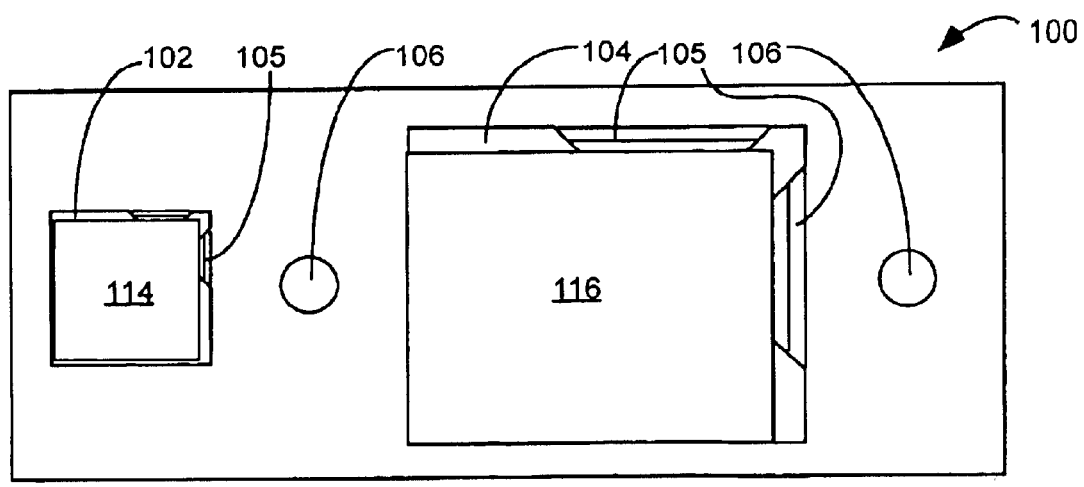
FIG. 4 is a top view of the frame shown in FIG. 1 with two chips that have been placed into the frame with their active surfaces facing down.
Figure 5:
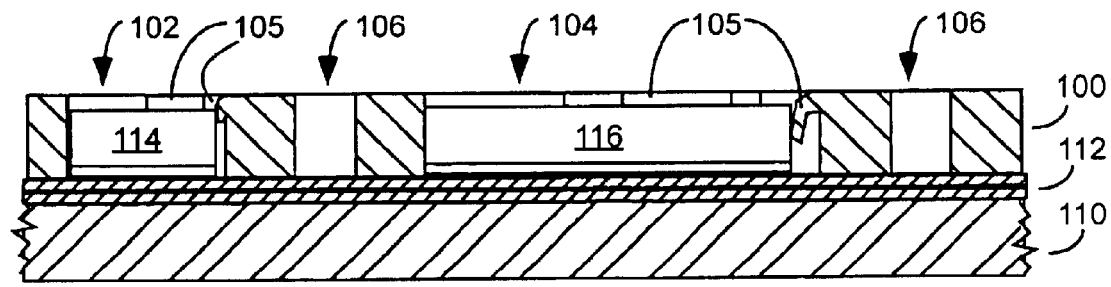
FIG. 5 is a cross-sectional view similar to that of FIG. 3 except that in it the chips shown in FIG. 4 are also shown in cross-section.

FIGS. 4 and 5 show the frame 100 after the field effect transistor chip 114 has been pressed into the frame's hole 102 and the controller chip 116 has been pressed into the frame's hole 104. As can be seen from FIGS. 4 and 5 this process of pressing the chips into the holes deforms the tabs 105 in a manner which causes them to press against, and help hold in place, those chips. The chips are placed into the holes 102 and 104 with their tops, that is, their active surfaces, pressing against the dicing tape. Pressing all the chips in a frame down all the way until their active surfaces are stopped by the dicing tape and the flat glass substrate below it causes the tops of the chips within a frame to be level with each other, which is helpful during later stages of manufacturing when it is desirable to interconnect electrical contacts of different chips.

Figure 6:
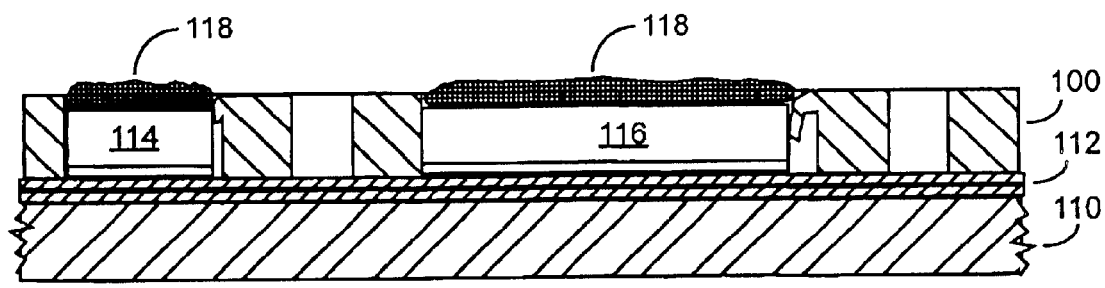
FIG. 6 is a cross-sectional view similar to that of FIG. 5 except that it shows thermally and electrically conductive epoxy that has been placed on the back of the two integrated circuit shown in FIG. 5.

FIG. 6 shows the assembly of FIG. 5 after a thermally and conductive epoxy paste 118 has been placed on the bottom surfaces (i.e., the surfaces opposite their active surfaces) of the integrated circuits 114 and 116.

FIGS. 7 through 10 are used to illustrates another embodiments of a frame, frame 100A, which can be used instead of the frame 100 shown in FIG. 1.

Figure 9:
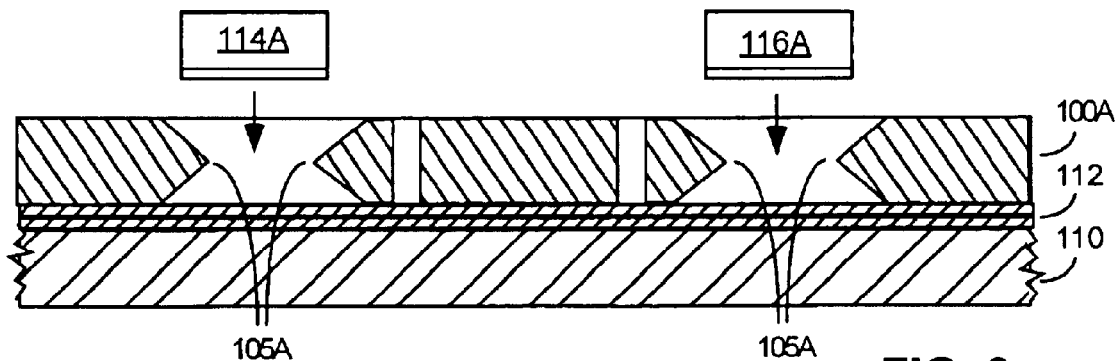
FIG. 9 is a cross-sectional view similar to that of FIG. 3 except at that in it the frame of FIGS. 7 and 8, rather than that of FIG. 1 is used, and except that it shows two chips about to be placed into the holes formed by the frame of FIGS. 7 and 8.
Figure 10:
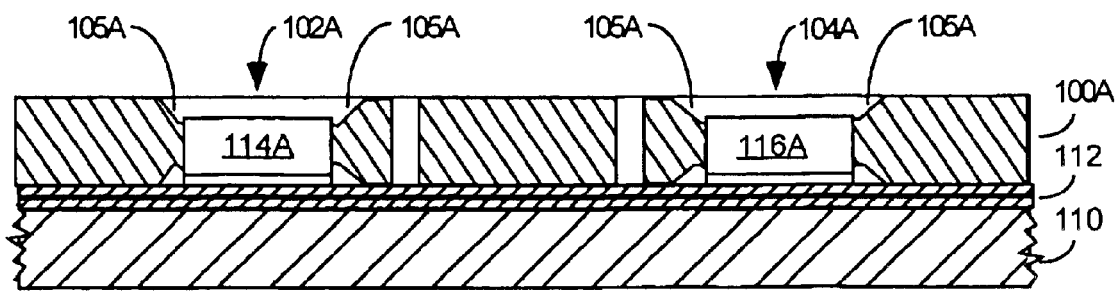
FIG. 10 is a cross-sectional view similar to that in FIG. 9, except that in net the two chips are sure in being held in place by their compression against the formerly doubled sides of the holes for receiving chips shown in FIG. 8.

The frame 100A includes holes 102A in 104A which are generally similar to the holes 102 and 104 shown in FIG. 1 except that instead of having tabs 105 on two sides, they have beveled edges 105A around all of their four sides. As is shown in FIGS. 9 and 10, when the integrated circuits 114A and 116A rare placed down into the holes 102A and 104A, respectively, the beveled edges 105A press tightly against the sides of the chip, so as to hold them into place. Normally the frame is heated someone before this insertion process to make the deformation of the beveled edges easier.

Returning now to the embodiment of the invention using the frame 100 of the type shown in FIG. 1, once the epoxy 118 has been placed on the back of the chips as shown in FIG. 6, the assembly comprising the glass substrate 110, the dicing tape 112, and the frame 100, including the chips which been mounted within it, is aligned with a bottom substrate 115. This alignment can be aided by looking through the glass substrate 110 and through via holes 106 to seek alignment with conductively filled vias 117. Such alignment can also be aided by the use of fiduciary marks on the substrate 115 and/or the frame 100 that are to be aligned.

Figure 11:
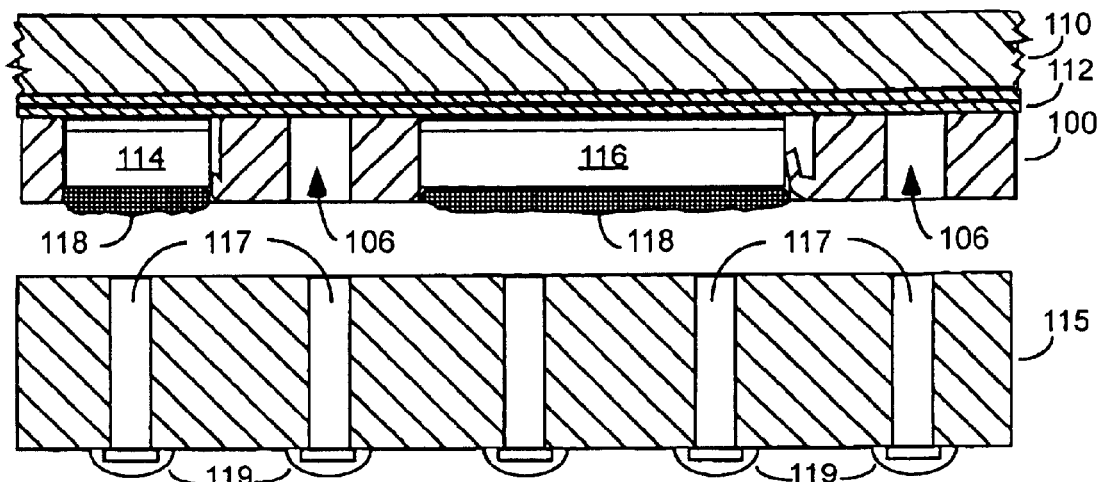
FIG. 11 is a cross-sectional view of the assembly shown in FIG. 6 as it is about to be placed in contact with a substrate on the opposite side of the plastic frame from the glass substrate.

In the embodiment shown in FIG. 11 the substrate 115 is a ball grid pad which has a plurality of vias 117 filled with conductive material, and gold plated ball grid pads 119 on its bottom surfaces. Normally the substrate will be a large sheet having a shape and area similar to both the plastic sheet containing the frames 100 and the substrate 110.

In other embodiments of the invention other types of substrates of a type suitable for use in multichip modules can be used.

Figure 39:
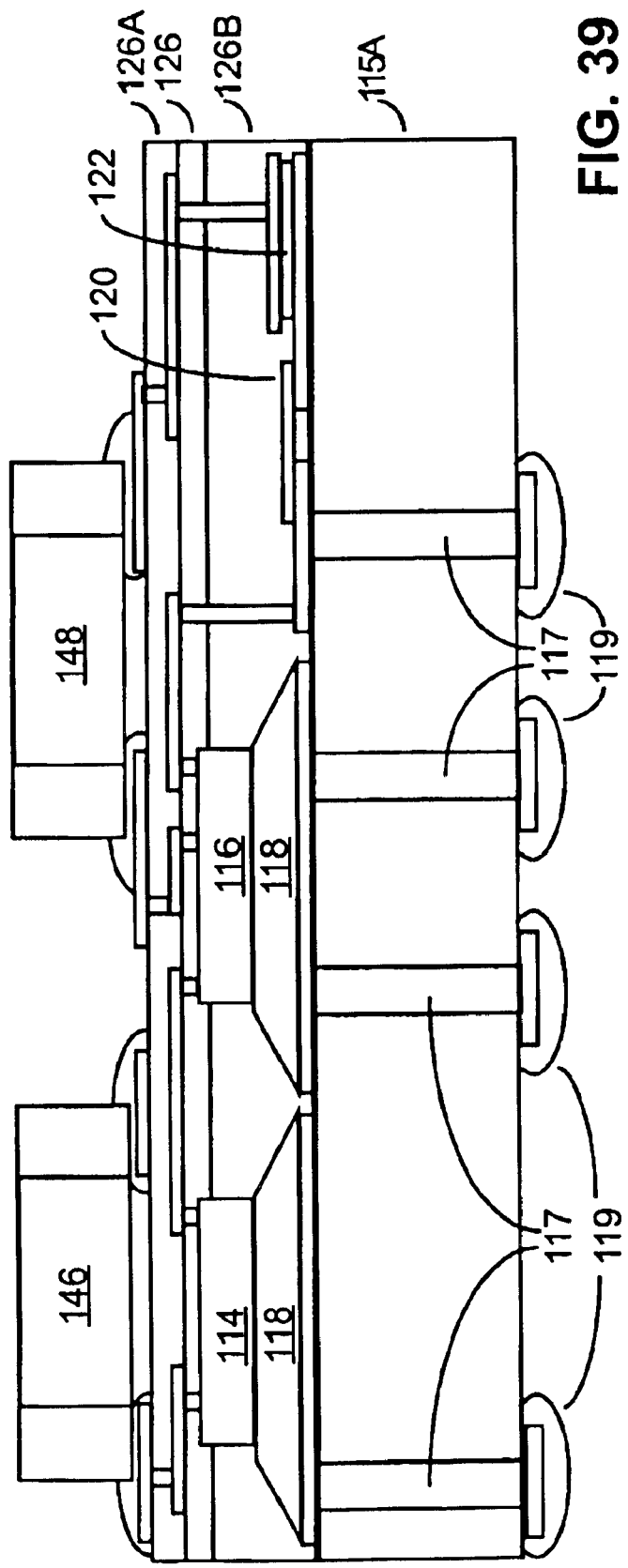
FIG. 39 is a cross-sectional view of an assembly somewhat similar to that shown in FIGS. 26 and 38, except that it does not seek to show the various seed layers in the conductive layers and it also shows that passive components can be formed on both the substrate of the multichip module its top layer.

As shown in FIG. 39 a substrate, such as the substrate 115A shown in that figure, can have passive components formed on it before it is joined with the chips 114 and 116. In FIG. 39 these passive components include a thin film resistor 120 and a thin film capacitor 122.

Figure 12:
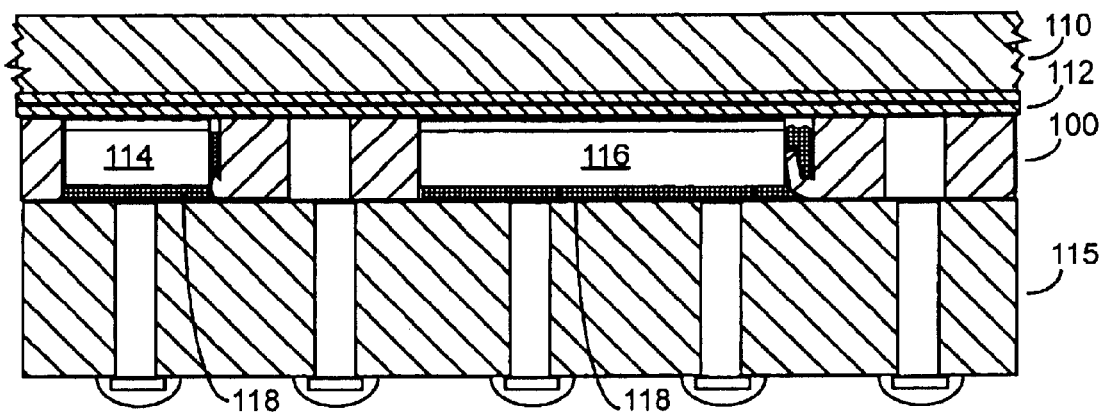
FIG. 12 is a cross-sectional view of the components of FIG. 11 after the second substrate has been attached to the back of the plastic frame.

FIG. 12 illustrates the assembly after the frame 100 and the chips it is holding have been bonded to the substrate 114. The pressure of the bottom substrate 115 against the epoxy 118 tends to force portions of that epoxy into the gaps between the chips and the frame 100, which helps to further bond those chips in place relative to the frame.

Figure 13:
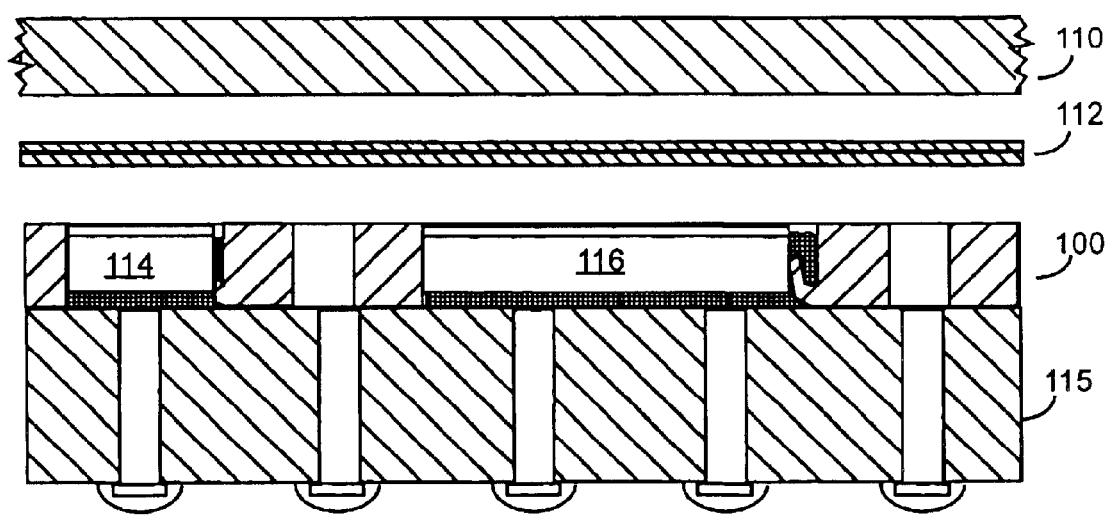
FIG. 13 is a cross-sectional view of the assembly shown in FIG. 12 after the glass substrate and the dicing tape have been removed.

Once the epoxy 118 has had a chance to cure and harden, ultraviolet radiation is passed through the glass substrate 110 so as to expose the adhesive on the dicing tape 112. This causes it to lose its adhesive nature. Once this has been done the substrate 110 and the dicing tape 112 can be removed from the assembly, as shown in FIG. 13

Figure 14:
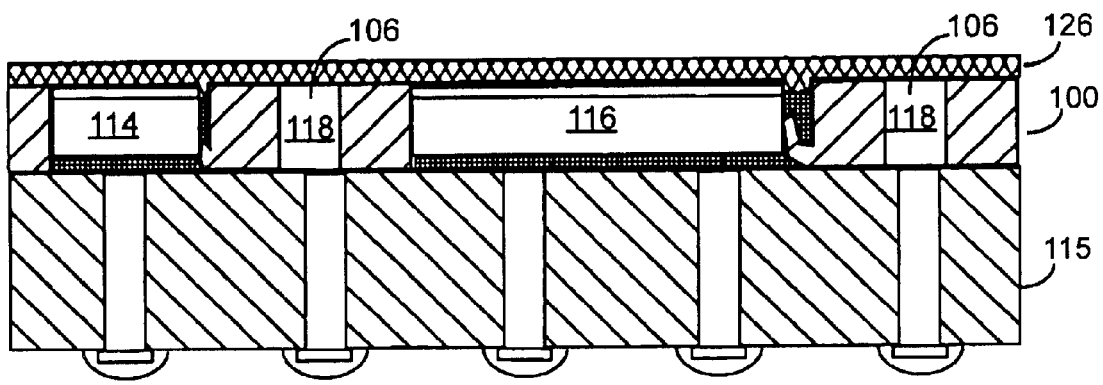
FIG. 14 is a cross-sectional view of the assembly of FIG. 13 after a layer of latex dielectric material has been spun upon its top surface.

FIG. 14 shows the assembly after its via holes 106 have been filled with electrically conductive epoxy 118 of the same type has been placed on the backs of the integrated circuits 114 and 116. In FIG. 14 and many other figures the hatching used to indicate the presence of that epoxy around the chips is not used in the vias 106 so as to make the image appear less cluttered. In other embodiments of the inventions the vias 106 can be filled with through-hole plating or other techniques known in the photolithographic arts for filling via holes.

Once the vias 106 have been filled with conductive material and the assembly has been heated to help that epoxy harden and become more conductive, a layer of liquid latex 126 is evenly spread across the top of the assembly. This is done by its spinning, in which centrifugal force is used to spread material across a surface. In some embodiments of the invention, this latex is a self-Vulcanizing latex, such as is sold by Haveatext, Inc.

After the latex 126 has had been hardened, a layer of photoresist 128 is deposited upon it and pattern by photolithographic techniques so as to create gaps 130 in that photoresist which leave portions of the latex surface 128 through which via holes are to be formed uncovered. The bonding pads on the integrated circuits 114 and 116 and via holes 106 over which the via holes are to be made in the latex layer 126 are large enough and far enough apart, and their position is sufficiently exactly known because of the relative rigidity of the frame and the accuracy of the positioning of the integrated circuits, that it is relatively easy to correctly locate via holes over them in the latex layer 126 when performing wafer scale photolithography without being able to see through the latex layer 126.

Figure 15:
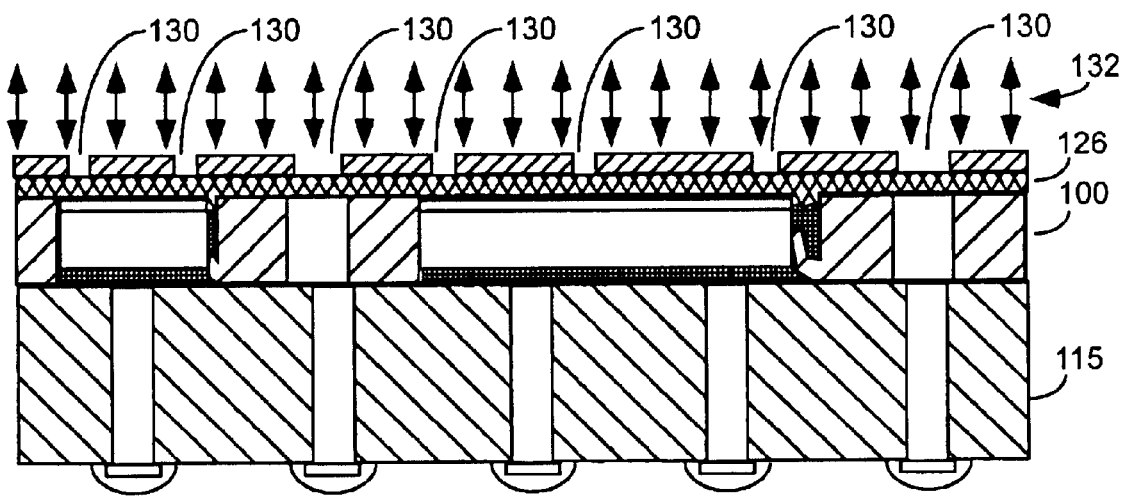
FIG. 15 is a cross-sectional view of the assembly of FIG. 14 after the latex has hardened and has had a layer of photoresist patterned upon it, while it is being subjected to a reactive plasma etch.

Once this is been done the assembly shown in FIG. 15 is submitted to a reactive ion etch represented by the vertical arrows 132. A reactive ion etch is one in which chemically reactive ions are rapidly moved back and forth in an oscillating electromagnetic field in a direction generally perpendicular to the surface being etched, so that they will collide with that surface with considerable energy, which enhances their etching chemical reaction with the material of that surface.

In a preferred embodiment of the invention, after this etch is performed, a barrier metal will be diffused onto the surface of the bond pads which have been exposed by the etch. This is done to prevent the metal of the copper layers that will be put down later from migrating into the copper aluminum alloy that is commonly used in bond pads.

Figure 16:
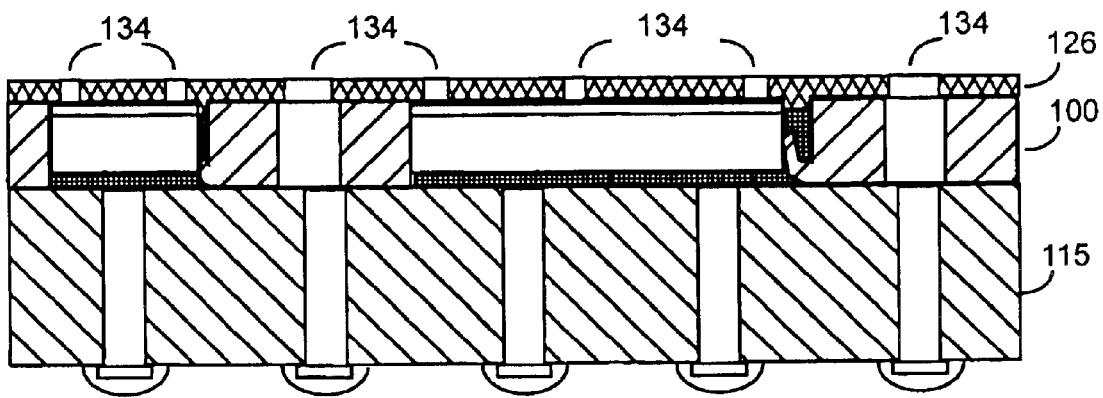
FIG. 16 is a cross-sectional view of the assembly of FIG. 15 after the plasma etch has been performed and the photoresist layer has been removed.

FIG. 16 illustrates the assembly of FIG. 15 after the ion etch has ended, and after the photoresist has been removed. As can be seen from this figure, after this process the latex layer 126 has had holes 134 etched through it in those locations which correspond to the openings 130 in the photoresist shown in FIG. 15. The purpose of these holes is to etch down to the bonding pads of the integrated circuits 114 and 116 and the top of the conductive via holes 106.

Figure 17:
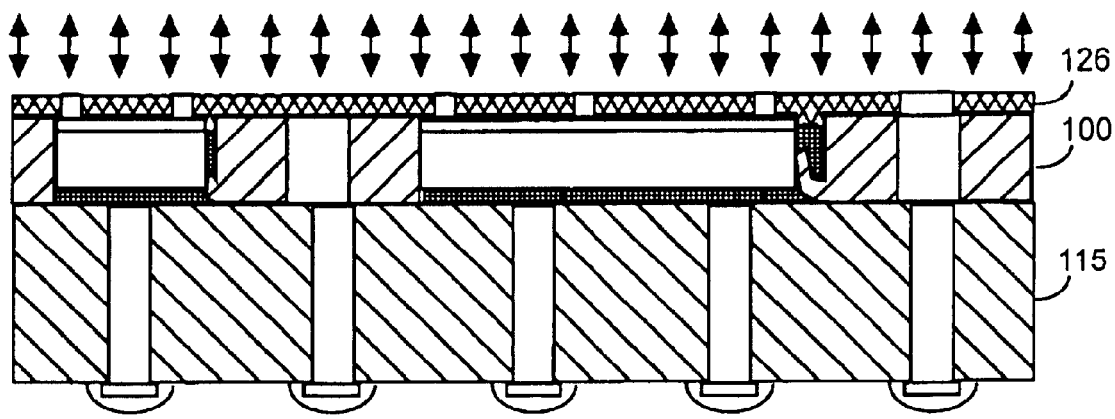
FIG. 17 is a cross-sectional view of the assembly of FIG. 16 while it is being submitted to a non-reactive ion etch.

FIG. 17 shows the assembly of FIG. 16 being submitted to a relatively brief non-reactive ion etch. The purpose of this etched is to physically rough up the surface of the otherwise relatively smooth latex layer 126. This is necessary because it is often difficult to deposit metal layers upon many dielectric materials such as latex or polyimide without first roughening their surface.

For this purpose a non-reactive etch is used, in which the ions bombard against the dielectric surface are inert chemicals. This is because, unlike the etched performed in the step of FIG. 15 in which it was desirable to bore all the way through portions of the latex layer 126, in this step the purpose of the etch is only to create peaks 130 and valleys 132, shown schematically in FIG. 18, in the latex surface.

Figure 18:
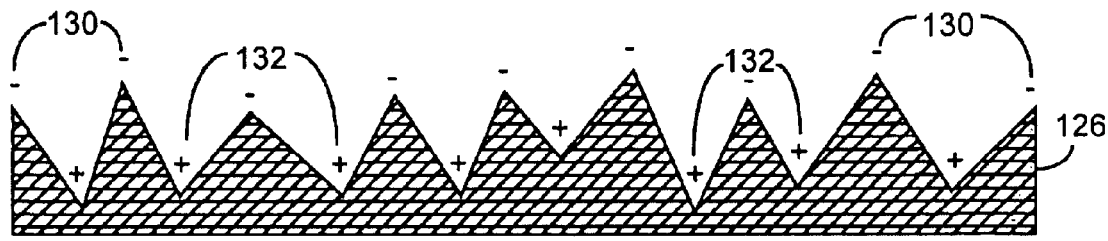
FIG. 18 is a schematic representation of the peaks and valleys which are formed in the surface of the latex dielectric material by the ion etch represented in FIG. 17.
Figure 19:
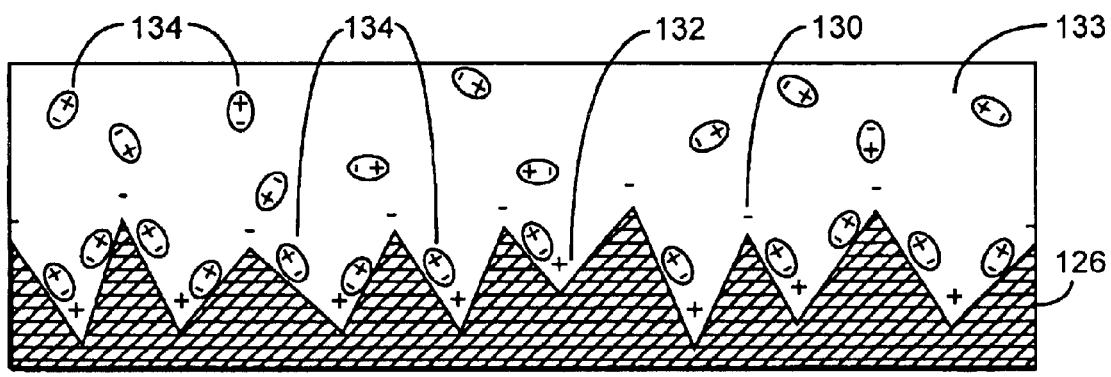
FIG. 19 is a schematic representation of how catalytic particles of a solution in which the latex surface is placed are attracted to regions between the peaks and valleys of latex surface shown in FIG. 18

As is indicated in FIG. 18, electric fields tend to accumulate in a portion of surface which is in the form of a small peak, and positive fields tend to develop in the corresponding valleys of such material. Thus the roughening of the latex surface tends to increase the van der Waal forces associated with it FIG. 19 schematically represents a step in which the surface of the assembly shown in FIG. 17 is dipped into a tin chloride solution 133 in which very fine metallic palladium particles 134 are suspended. Preferably the metal particles are quite small, containing only two to six atoms. The tin chloride stabilizes these particles, preventing them from conglomerating into larger particles and precipitating.

In such a solution the palladium particles and the water molecules that surround them have a slight dipole moment, as is indicated by the plus and minus signs shown on the particles 134 in FIG. 19. This causes those particles to be attracted to the opposite dipole field which exists between the peaks 130 in the valleys 132 in the roughened surface of the latex 126. This is indicated in FIG. 19 by the attachment of many of the particles 134 to the latex surface between those peaks and valleys.

In other embodiments of the invention the catalytic particles used are made of any metal in the eighth group on periodic table. This group includes cobalt, palladium, ruthenium, rhodium, platinum, iridium, osmium, nickel, and iron.

Figure 20:
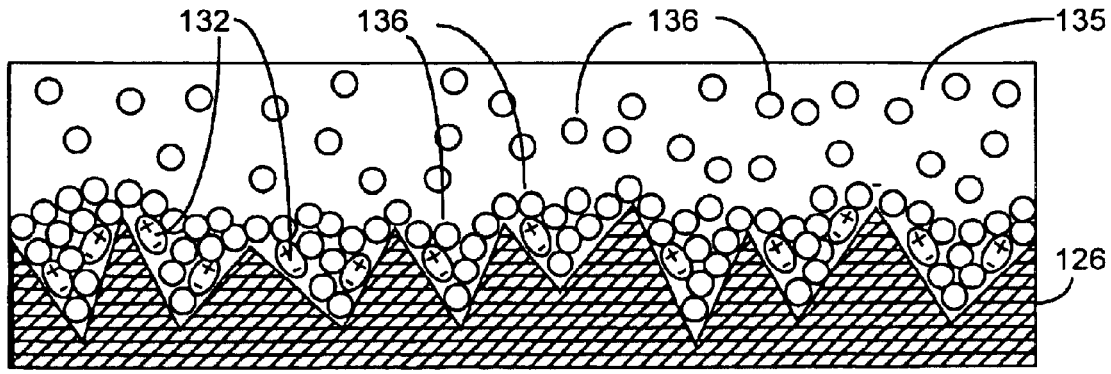
FIG. 20 is a highly schematic representation of the autocatalytic electroless plating process which takes place on the latex surface shown in FIG. 19 when it is placed in a metal salt solution in a metastable equilibrium with a reducing agent.

Once the surface of the latex has been seeded with the metal palladium particles 134, that surface is removed from the solution 133 and placed in a solution 135 shown in FIG. 20. The solution 135 is a metal salt solution in which the metal salt is in a metastable equilibrium with a reducing agent that causes the metal in the solution to be near the verge of precipitating. When this method is to deposit copper, as in the case of the particular embodiment of the invention being described, a metastable copper metal salt solution of a type commonly used in electroless plating is normally used.

When the latex surface 126 which has been seeded with palladium particles 130 is placed in the metastable solution 135, the palladium particles 132 act as catalysts that causes copper atoms 136 to precipitate out of the metastable solution. Once the copper has started to precipitate, it acts as a catalyst to encourage further precipitation of copper. This causes the surface of the latex 126 to be covered with a thin conducting seed layer 138 of copper metal.

Figure 21:
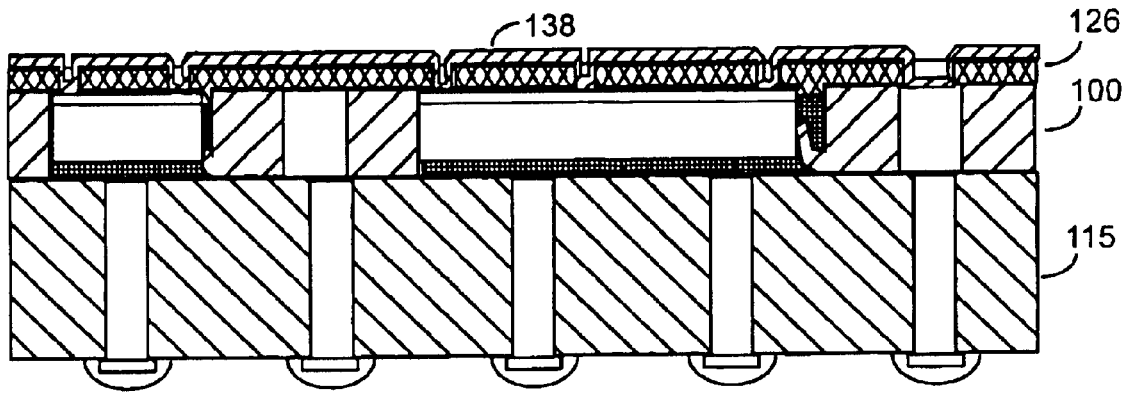
FIG. 21 is a cross-sectional view of the assembly shown in FIG. 17 after a thin seed layer of conductive material has been deposited by the process represented in FIG. 20 (vertical dimensions are greatly exaggerated in these figures, and this seed layer is much thinner relative to other layers than represented in this figure)

FIG. 21 illustrates the assembly FIG. 17 after this thin copper seed layer 138 has been placed upon it. In FIG. 21 the layer 138 has been made relatively thick so as to make it easy to see. In actual practice the layer will normally be extremely thin, but it will be thick enough to act as an electrode in the subsequent process of electroplating which will be used to much more rapidly put down a copper layer of sufficient thickness to provide a proper interconnect in a multichip module.

Figure 22:
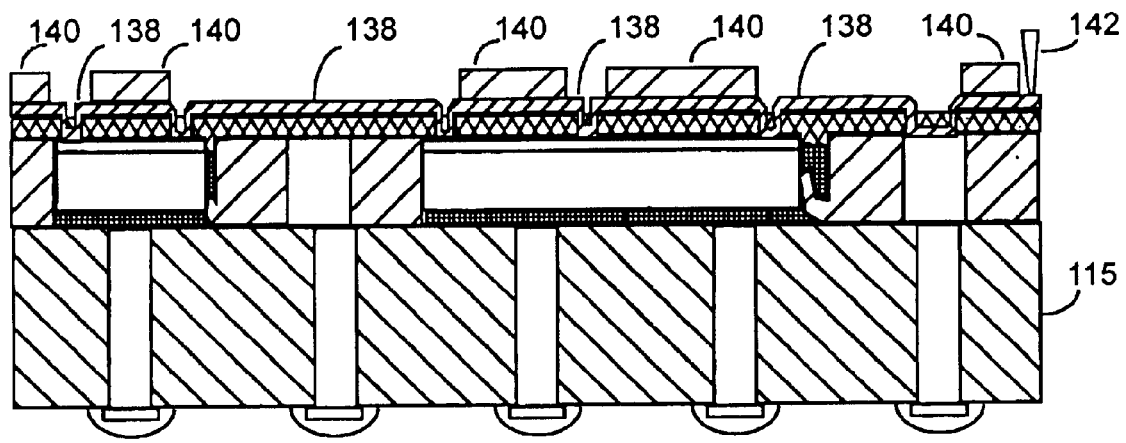
FIG. 22 is a cross-sectional view of the assembly shown in FIG. 21 after a layer of photoresist has been placed upon it and patterned.

FIG. 22 illustrates the assembly shown in FIG. 21 after a layer of photoresist 140 has been placed upon it and subsequently been patterned to expose those portions of the copper seed layer upon which further copper deposition is desired. Also shown in FIG. 22 is an electrical conductor 142 which touches the seed layer to provide a voltage for the subsequent electroplating process.

Electroplating is used to provide additional thickness of copper because it lays down copper at a much higher rate than electroless plating, and because it makes it easier to placed down thicker layers than is normally possible with electroless plating.

It would be possible to produce a conductive layer entirely by electroless deposition (although currently it is difficult to achieve electroless plated copper layers which are thicker than one half micron in height). In this case the deposition of the catalyst particles shown in FIG. 19 and the electroless deposition illustrated in FIG. 20 would be performed on the latex surface through patterned photoresist after the portions of that surface which were not covered by photoresist underwent the non-reactive ion etch illustrated in FIG. 17.

Figure 23:
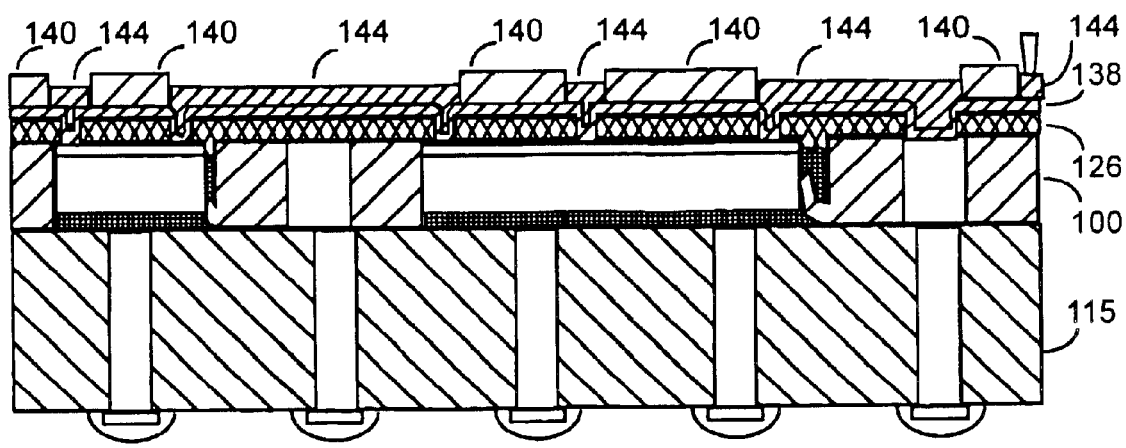
FIG. 23 is a cross-sectional view of the assembly shown in FIG. 22 after a substantially thicker layer of additional conductive material has been deposited by electroplating over the portions of the conductive seed layer which have not been covered by photoresist.

FIG. 23 illustrates the assembly of FIG. 22 after electroplating has been used to deposit a much thicker layer of copper 144 on those portions of the seed layer 138 which have been exposed through the photoresist 140.

Figure 24:
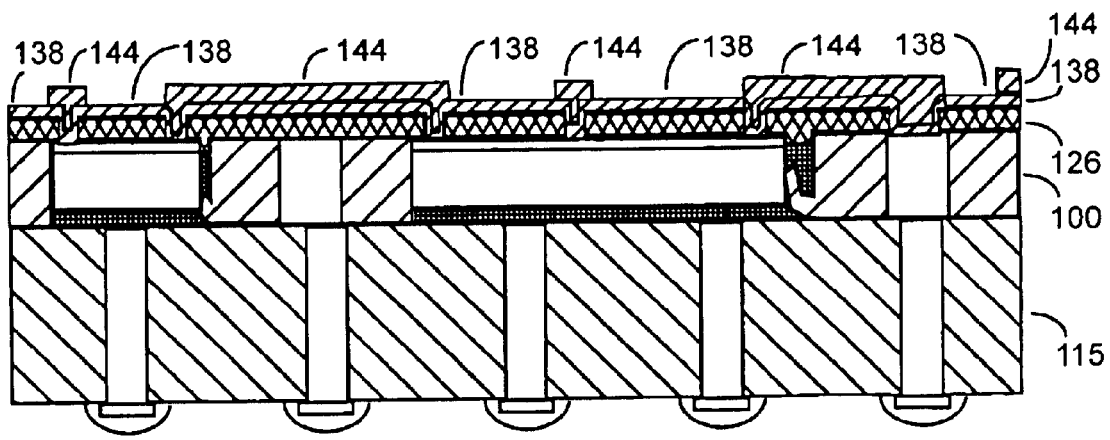
FIG. 24 is a cross-sectional view of the assembly shown in FIG. 23 once the photoresist shown in that figure has been removed.

FIG. 24 illustrates the assembly of FIG. 23 after the photoresist 140 has been removed. At this point all of the top surface of the assembly is covered with a thin seed layer of copper 138, and those portions of the top surface which are intended to be conductive are covered with a much thicker layer of copper 144 that has been deposited through electroplating.

Figure 25:
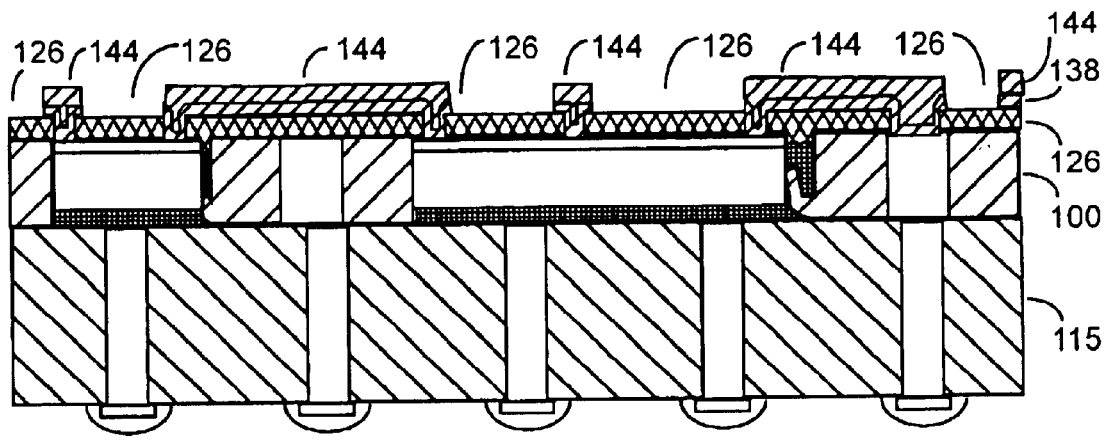
FIG. 25. is a cross-sectional view of the assembly shown in FIG. 24 after portions of the thin conductive seed layer shown in FIG. 21 not covered by the much thicker electroplated layer deposited in FIG. 23 have been etched away.

FIG. 25 shows the assembly FIG. 25 after those portions of the seed layer 138 which have not been covered by the thick electroplated ayer 144 have been etched away so as to achieve desired electrical isolation between separate intended conductive portions of the copper layer 144.

Those skilled in the photolithographic art will understand that the steps shown in FIGS. 14 through 25 can be repeated to add one or more additional layers of latex and/or copper to the multichip module.

Figure 26:
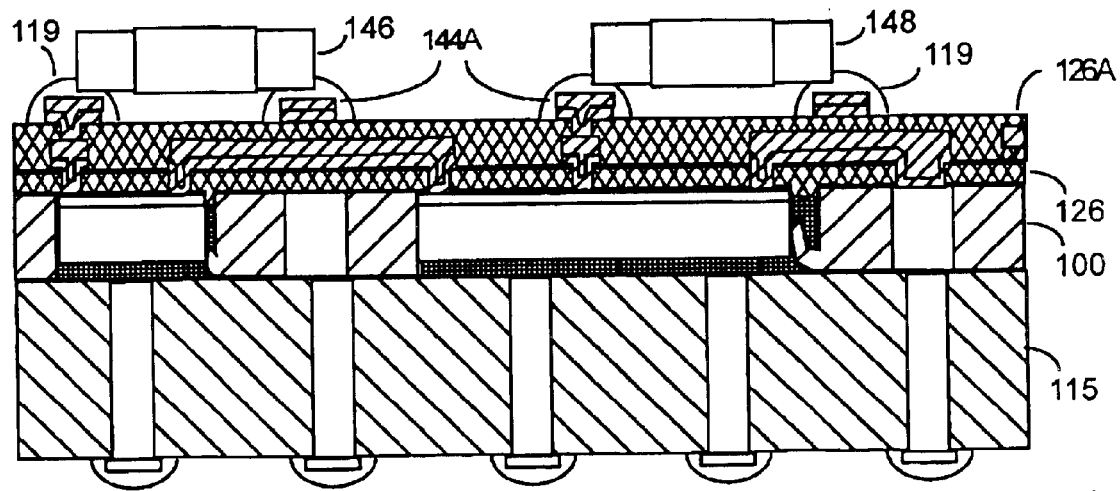
FIG. 26 is a cross-sectional view of the assembly shown in FIG. 25 after an additional layers of latex and conductor have been placed upon it by repeating the steps shown above regard FIGS. 14 through 25, and after gold contact bumps and to passive components have been attached to that top layer.
Figure 27:
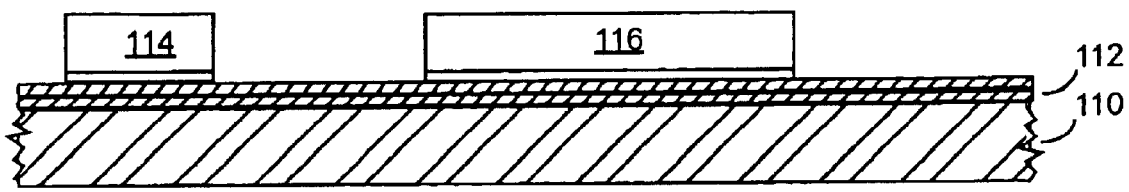
FIG. 27 is a cross-sectional view of initial steps in an alternate method of fabricating a multichip module in which integrated circuits are placed facedown against a piece of dicing tape on top of a glass substrate without the use of a plastic frame of the type shown in FIGS. 1 and 7.

FIG. 26 illustrates the multichip module of FIG. 25 after one additional layer of latex 126A and one additional layer of copper 144A have been added. The assembly FIG. 26 has also had gold ball grid pads 119 added to its top layer of copper so that electrical connections can be made to them. In this figure a chip surface mount capacitor 146 and they a chip surface mount inductor 148 have been attached to those ball grid pads to add additional capabilities to the multichip module. In current embodiments of the invention no additional protective layer is placed on the top latex layer of the module, but in other embodiments such an additional protective layer could be used.

FIGS. 27 through 38 illustrates a method of manufacturing multichip module's that is similar to that described with regard FIGS. 2 through 26, except that it does not use the plastic frames of the type shown in FIGS. 1 and 7.

In this method integrated circuit chips 114 and 116 have their active surfaces attached to the glass substrate 110 by the dicing tape 112. They are positioned upon the dicing tape without the use of frames of the type described above by pick-and-place equipment.

Figure 28:
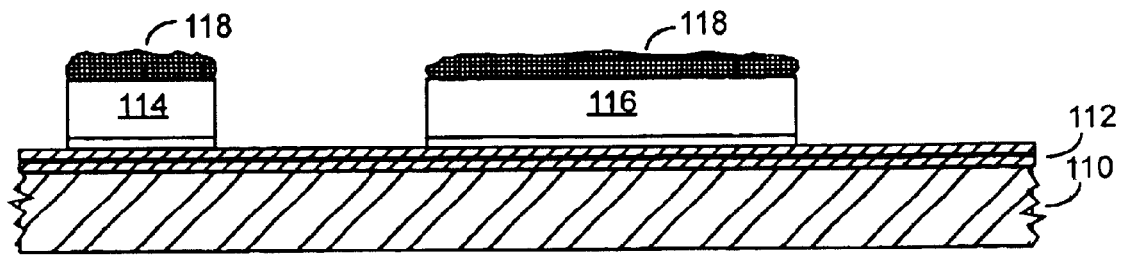
FIG. 28 is a cross-sectional view of the assembly shown in FIG. 27 after thermally and electrically conductive epoxy is been placed on the back of its integrated circuits.

In FIG. 28 the conductive epoxy 118 is placed on the back of the chips 114 and 116.

Figure 29:
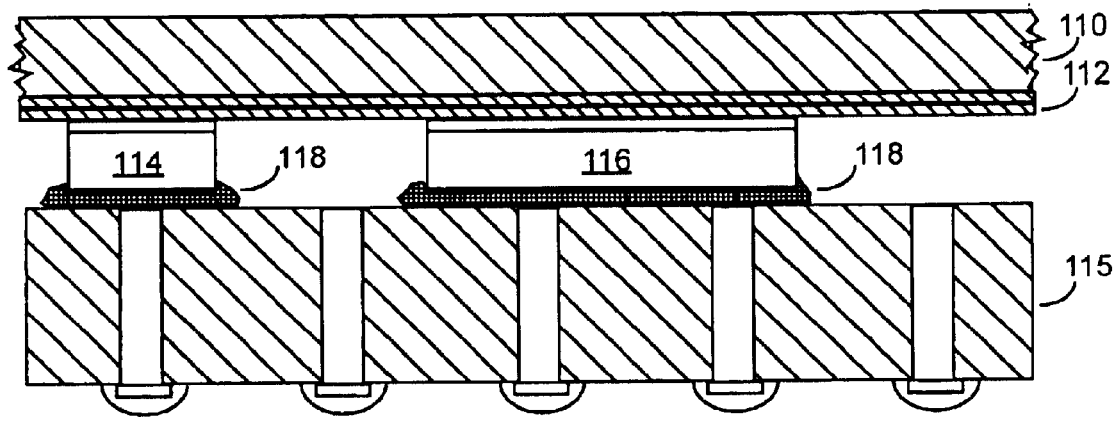
FIG. 29 is a cross-sectional view of the assembly shown in FIG. 28 after the bottoms of its integrated circuits have been attached to a second substrate.
Figure 30:
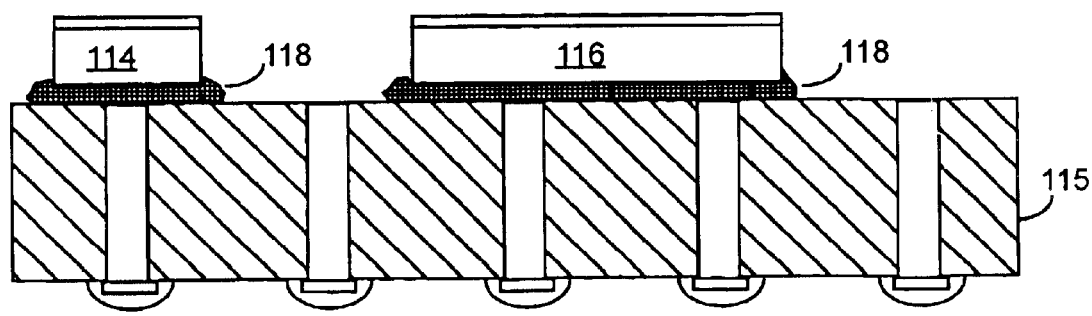
FIG. 30 is a cross-sectional view of the assembly shown FIG. 29 after the glass substrate and dicing tape have been removed from the top of its integrated circuits.
Figure 31:
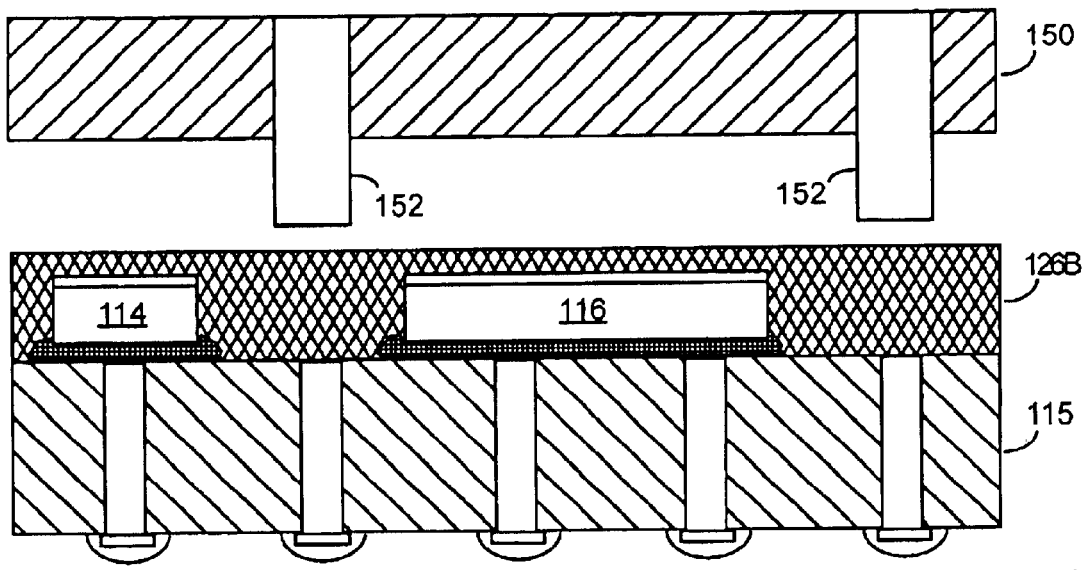
FIG. 31 is a cross-sectional view of the assembly shown in FIG. 30 after a layer of liquid latex dielectric has been placed down on top of its chips and bottom substrate, with a third Teflon coated substrate, containing Teflon coated pins for forming via holes in the latex, is positioned to descend down upon the latex.

In FIG. 29 the assembly of FIG. 28 is flipped upside-down so the chips 114 and 116 can be mounted upon a substrate 115, which can be of the same types of substrates described above with regard to FIG. 11.

Once the epoxy 118 has had a chance to firmly bond chips 114 and 116 to the substrate 115, the dicing tape 112 is exposed to radiation through the glass 110. This causes the dicing tape to lose its adhesive characteristic, freeing the assembly shown in FIG. 30 from the glass substrate and the dicing tape.

Then a layer of liquid latex 126B is placed over the substrate 115 in sufficient thickness to cover the tops of the chips 114 and 116. A third substrate 150 is position so that pins 152 will push via holes into the latex 126B. The surface of the substrate 150 facing the latex and the surface of its pins 152 are covered with Teflon so that they will not stick to the latex.

Figure 32:
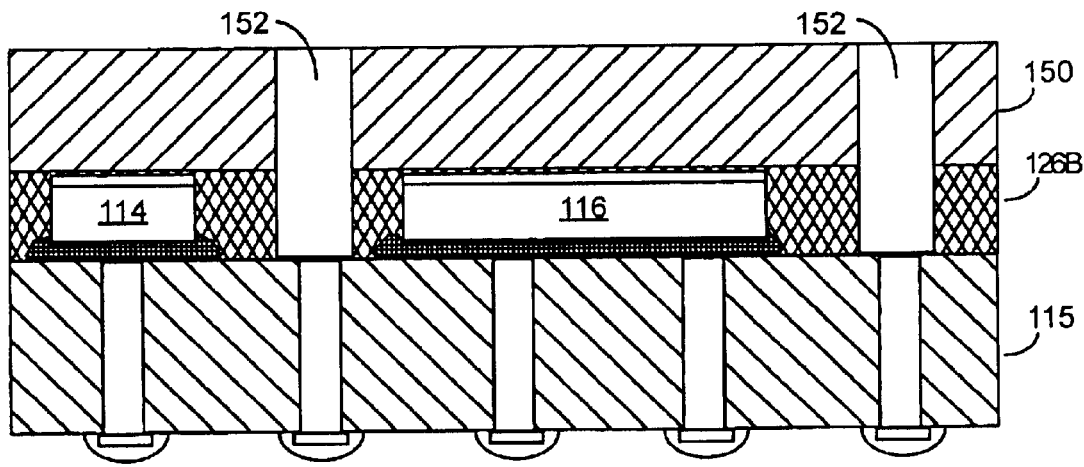
FIG. 32 is a cross-sectional view of the assembly shown in FIG. 31 at a time when the third substrate is pressing down against the top of the liquid latex layer.

In FIG. 32 the substrate 150 and its pins 152 are shown pressed against the latex layer 126B so as to flatten out that layer and to cause the pins 152 to extend substantially all the way down to the top surface of the substrate 115.

Figure 33:
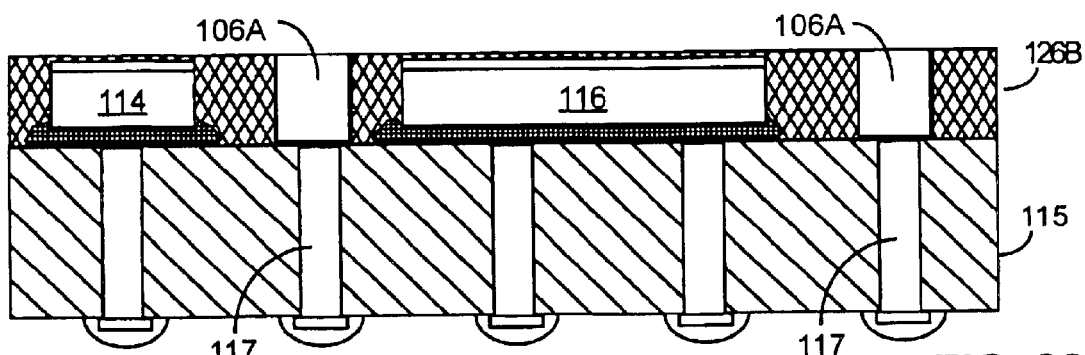
FIG. 33 is a cross-sectional view of the assembly of FIG. 23 after the latex has been hardened and the third substrate has been removed.

Once the latex layer 126B has had a chance to cure, the substrate 150 and its pins 152 are removed from the assembly of FIG. 32, leaving the assembly as shown in FIG. 33. In this assembly the top of the latex layer 126B is close to being coplanar with tops of the chips 114 and 116. In addition via holes 106A have been formed in the layers 126B which connect down to the vias 117 contained in the substrate 115.

Figure 34:
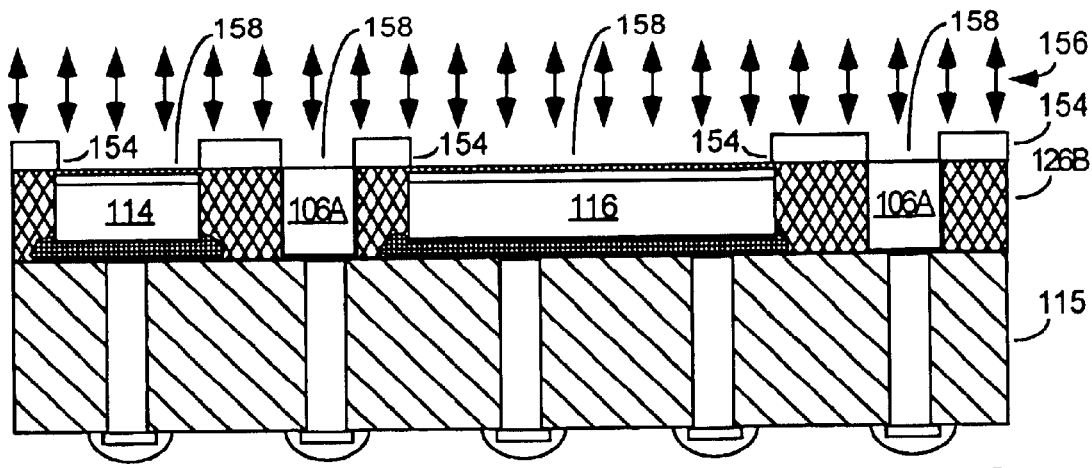
FIG. 34 is a cross-sectional view of the assembly shown in FIG. 33 after a layer of photoresist has been placed upon it and patterned and while it is undergoing a reactive ion etch removed unwanted portions of the latex.

Next a layer 154 of photoresist is deposited on top of the latex layer 126B and is patterned so as to expose portions that latex layer which are to be removed. Then as indicated in FIG. 34 the assembly is submitted to a reactive ion etch 156 to remove those undesired portions of the latex. This is done to remove latex from the tops of the chips 114 and from the bottoms of the via holes 106A.

Figure 35:
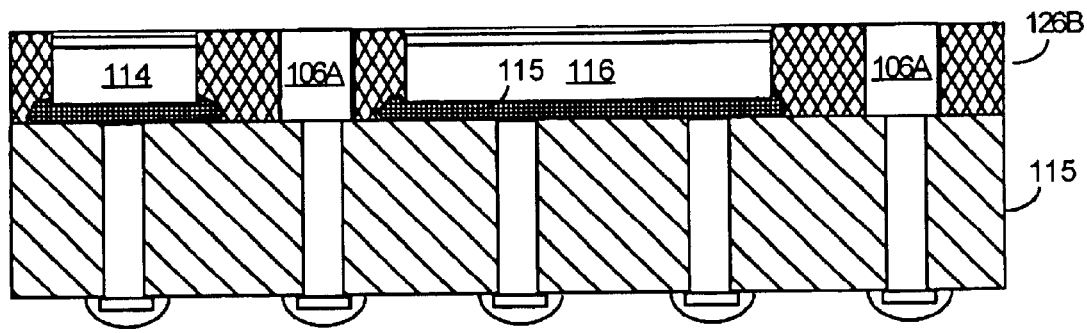
FIG. 35 is a cross-sectional view of the assembly shown in FIG. 34 after the reactive ion etch is complete and the photoresist shown in FIG. 34 has been removed.
Figure 36:
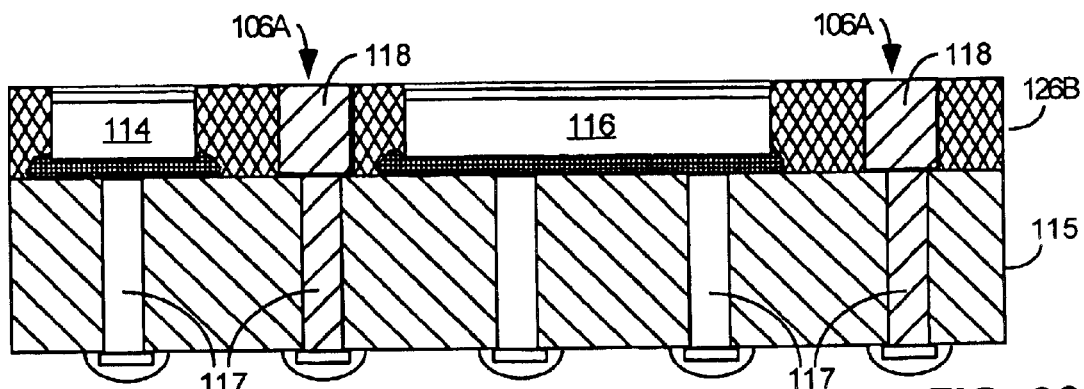
FIG. 36 is a cross-sectional view of the assembly shown in FIG. 35 after conductive material has been placed into the two via holes which a been formed by the Teflon coated pins of the third substrate.

FIG. 35 illustrates the assembly of FIG. 34 after the ion etched has remove the undesired latex and after the photoresist 154 has been removed.

FIG. 35 illustrates the assembly after the via holes A have been filled with conductive material, such as the conductive epoxy 118 which is also used to attach the chips 114 and 116 to the substrate 115.

Figure 37:
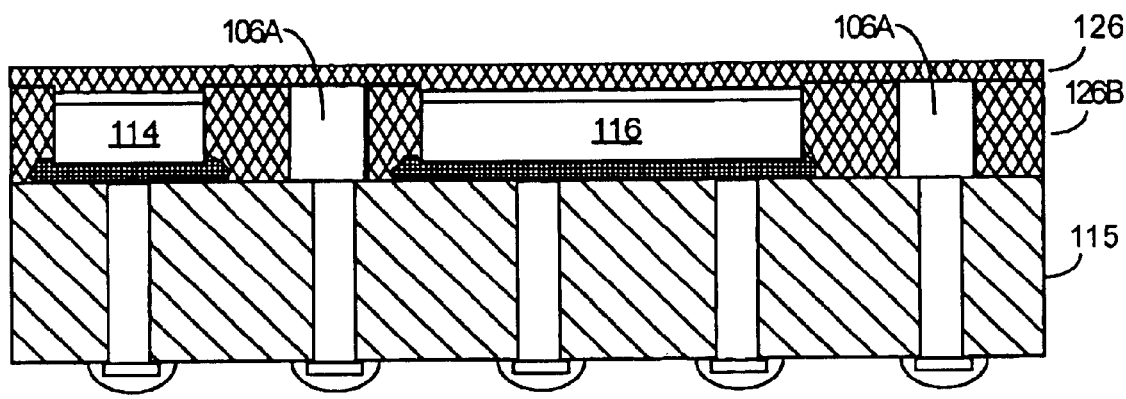
FIG. 37 is a cross-sectional view of the assembly shown in FIG. 36 after a thin layer of latex similar to that shown in FIG. 14 has been placed upon its surface.

After this epoxy 118 has been heated so as to harden it and make it more conductive, the assembly is coated with a thin layer of latex 126 as shown in FIG. 37.

From this point forward, the further assembly of the multichip module in FIG. 37 is equivalent to that of the multichip module shown in FIG. 14.

Figure 38:
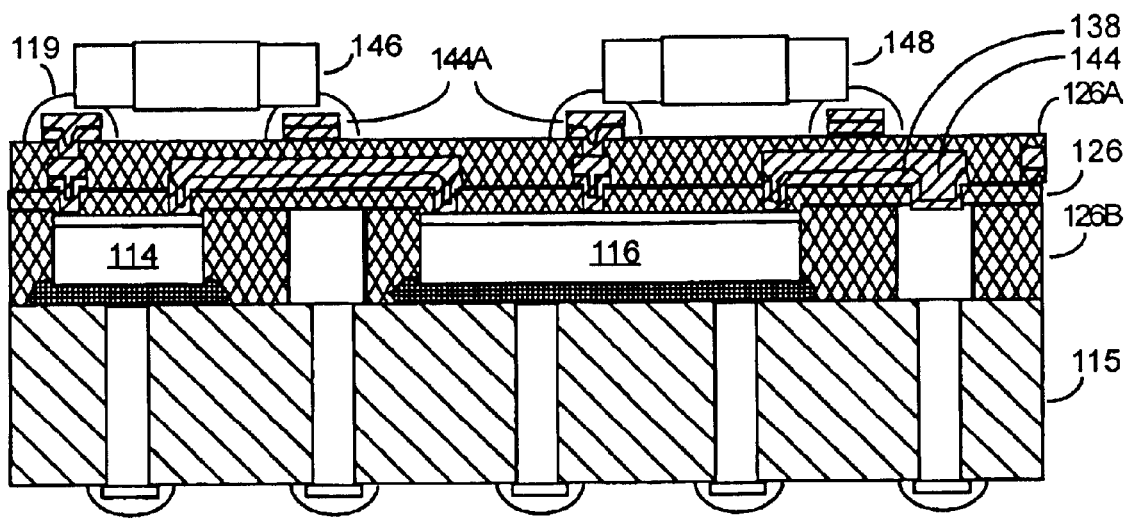
FIG. 38 is a cross-sectional view of the assembly shown in FIG. 37 after one more layers of latex and conductor have been formed upon it by steps similar to those shown in FIGS. 15 through 26.

As shown in FIG. 38, such further assembly can cause the assembly of FIG. 37 to have all the elements of the multichip module shown in FIG. 26.

FIG. 39 is an illustration of a multichip module which is similar to that shown in FIG. 38 except that in its the copper see layers are not separately shown and the substrate 115A shown in FIG. 39 has had passive components formed on its surface before was attached to the integrated circuits 114 and 116. These components include a thin film resistor 120 and a thin film capacitor 122.

It should be understood that the foregoing description and drawings are given merely to explain and illustrate and that the invention is not limited thereto except insofar as the interpretation of the appended claims are so limited. Those skilled in the art who have the disclosure before them will be able to make modifications and variations therein without departing from the scope of the invention.

For example, it should be understood that aspects of the present invention make it possible to electrolessly plate conductive layers or electrolessly plate seed layers for using in electroplating subsequent thicker layers. This electroless plating can be performed on materials such as latex, polyimide, and other smooth dielectric or materials on which it has previously been difficult to perform such electroless plating. Not only do these aspects of the invention allow metal material to be deposited upon such dielectrics, they allow this deposition to take place quickly, inexpensively, and at a sufficiently low-temperature to allow it to be used on assemblies containing materials which could not be submitted to such high-temperature metal deposition processes as sputtering. For example, such plating techniques can be used to fabricate electrical or electronic components on plastic substrates, such as low-cost plastic display devices, and plastic Micro Electromechanical Machine devices.

The aspects of the present invention relating to the use of metal seed particles to aid in electroless plating are applicable to the plating of metals other than copper. In fact this technique can be used in combination with a deposition of almost any metal which can be deposited by electroless plating. In aspects of the invention which use both a dielectric material and a conductive layer made of material which are relatively flexible, the combination of latex dielectric and a copper conductive layer is a relatively beneficial want because both materials are relatively flexible, and copper is an extremely good conductor .

What we claim is:

1. An electrical circuit comprised of:

at least one dielectric layer comprised of latex; and at least a corresponding number of layers of electrically conductive material patterned to form multiple electrical interconnects, at least one of the corresponding number of electrically conductive material layers disposed above a corresponding one of the at least one dielectric layer;

wherein one or more of said at least one dielectric layer comprised of latex has a top surface that contains peaks and valleys of a size that would not occur on the top surface of the latex had it not been roughened, and one or more of said conductive layers is formed of a first conductive metal that substantially fills said valleys formed in the portion of the latex layer's top surface over which the conductive layer's metal has been patterned, so as to increase the ability of said metal to adhere to said latex surface.

2. A circuit as in claim 1 wherein the portions of said one or more layers of the first conductive metal adjacent said latex layer between said peaks and valleys contain particles of a second metal that were used as catalytic seed particles to promote the deposition of said first metal onto the roughened top surface of said latex layer.

3. A circuit as in claim 2 wherein a majority of the catalytic seed particles contained in said first conductive metal adjacent the top surface of said latex layer contain only two to six atoms of said second metal.

4. A circuit as in claim 2 wherein the second metal of which said catalytic seed particles are formed is a metal in the eighth group of the periodic table.

5. A circuit as in claim 2 wherein said second metal is palladium.

6. A multichip module comprising:

a plurality of integrated circuits mounted on a substrate;

at least one flexible dielectric layer comprised of latex; and at least a corresponding number of layers of electrically conductive material patterned to form multiple electrical interconnects between bonding pads on different ones of said integrated circuits, at least one of the corresponding number of electrically conductive material layers disposed above a corresponding one of the at least one flexible dielectric layer;

wherein one or more of said at least one flexible dielectric layer comprised of latex has a top surface that contains peaks and valleys of a size that would not occur on the top surface of the latex had it not been roughened, and one or more of said conductive layers is formed of a first conductive metal that substantially fills said valleys formed in the portion of the latex layer's top surface over which the conductive layer's metal has been patterned, so as to increase the ability of said metal to adhere to said latex surface.

7. A multichip module as in claim 6 wherein the portions of said one or more layers of the first conductive metal adjacent said latex layer between said peaks and valleys contain particles of a second metal that were used as catalytic seed particles to promote the deposition of said first metal onto the roughened top surface of said latex layer.

8. A multichip module as in claim 7 wherein a majority of the catalytic seed particles contained in said first conductive metal adjacent the top surface of said latex layer contain only two to six atoms of said second metal.

9. A multichip module as in claim 8 wherein said second metal is palladium.

10. A multichip module as in claim 7 wherein the second metal of which said catalytic seed particles are formed is a metal in the eighth group of the periodic table.

* * * * *